(12) United States Patent
Herbordt

(10) Patent No.: US 11,422,160 B2
(45) Date of Patent: Aug. 23, 2022

(54) MEASUREMENT SYSTEM AND METHOD FOR GENERATING A TRIGGER SIGNAL FOR A MEASUREMENT SYSTEM

(71) Applicant: Rohde & Schwarz GmbH & Co. KG, Munich (DE)

(72) Inventor: Wolfgang Herbordt, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 503 days.

(21) Appl. No.: 16/230,647

(22) Filed: Dec. 21, 2018

(65) Prior Publication Data
US 2020/0200801 A1 Jun. 25, 2020

(51) Int. Cl.
*G01R 13/02* (2006.01)

(52) U.S. Cl.
CPC ..... *G01R 13/0254* (2013.01); *G01R 13/0245* (2013.01); *G01R 13/0272* (2013.01)

(58) Field of Classification Search
CPC ............ G01R 13/0254; G01R 13/0245; G01R 13/0272
USPC .......................................................... 702/67
See application file for complete search history.

(56) References Cited

U.S. PATENT DOCUMENTS

| | | | |
|---|---|---|---|
| 4,585,975 A * | 4/1986 | Wimmer ................ | G01R 13/22 315/307 |
| 7,191,079 B2 | 3/2007 | Smith et al. | |
| 2005/0225310 A1* | 10/2005 | Smith ................ | G01R 13/0254 324/121 R |
| 2007/0200550 A1* | 8/2007 | Corredoura ........ | G01R 13/0254 324/121 R |
| 2012/0268101 A1* | 10/2012 | Weller ............... | G01R 13/0254 324/76.11 |
| 2017/0031336 A1* | 2/2017 | Lehane .............. | G01R 13/0254 |
| 2020/0132727 A1* | 4/2020 | Lehane ................... | H04L 69/12 |

OTHER PUBLICATIONS

Op Amp as Comparator Circuit and Working Operation, Elprocus, pp. 1-5, Jul. 5, 2018. (Year: 2018).*
Op-amp Comparator, pp. 1-15. Printed on Aug. 27, 2021. (Year: 2021).*
Comparator Circuit Working and Applications, Elprocus, pp. 1-6, 2013-2021. (Year: 2013).*
Comparator, Wikipedia, pp. 1-9, Aug. 2021. (Year: 2021).*

* cited by examiner

*Primary Examiner* — Michael P Nghiem
(74) *Attorney, Agent, or Firm* — Christensen O'Connor Johnson Kindness PLLC

(57) ABSTRACT

A measurement system has an analog channel comprising an analog-to-digital converter for converting an external analog input signal into a corresponding digital input signal, an external trigger input for receiving an external trigger signal comprising a comparator configured to compare the external trigger signal against a trigger threshold signal for generating a binary trigger signal, and a digital signal processing unit. The digital signal processing unit comprises a digital trigger unit configured to receive the digital input signal and to generate at least one trigger event signal based on the digital input signal, and a trigger logic unit configured to receive the at least one trigger event signal and the binary trigger signal to generate a combined trigger signal. Further, a method for generating a trigger signal for a measurement system is described.

16 Claims, 5 Drawing Sheets

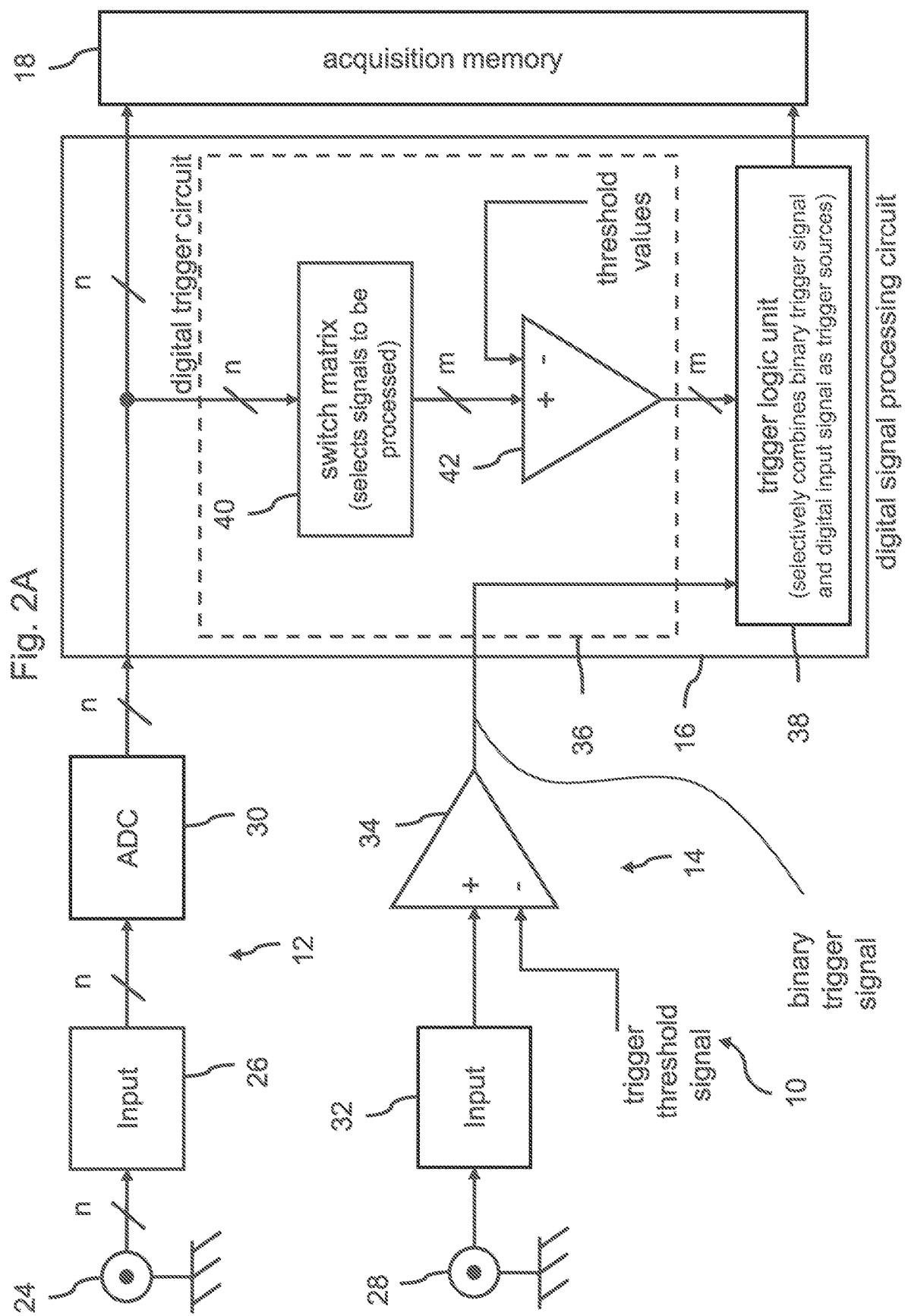

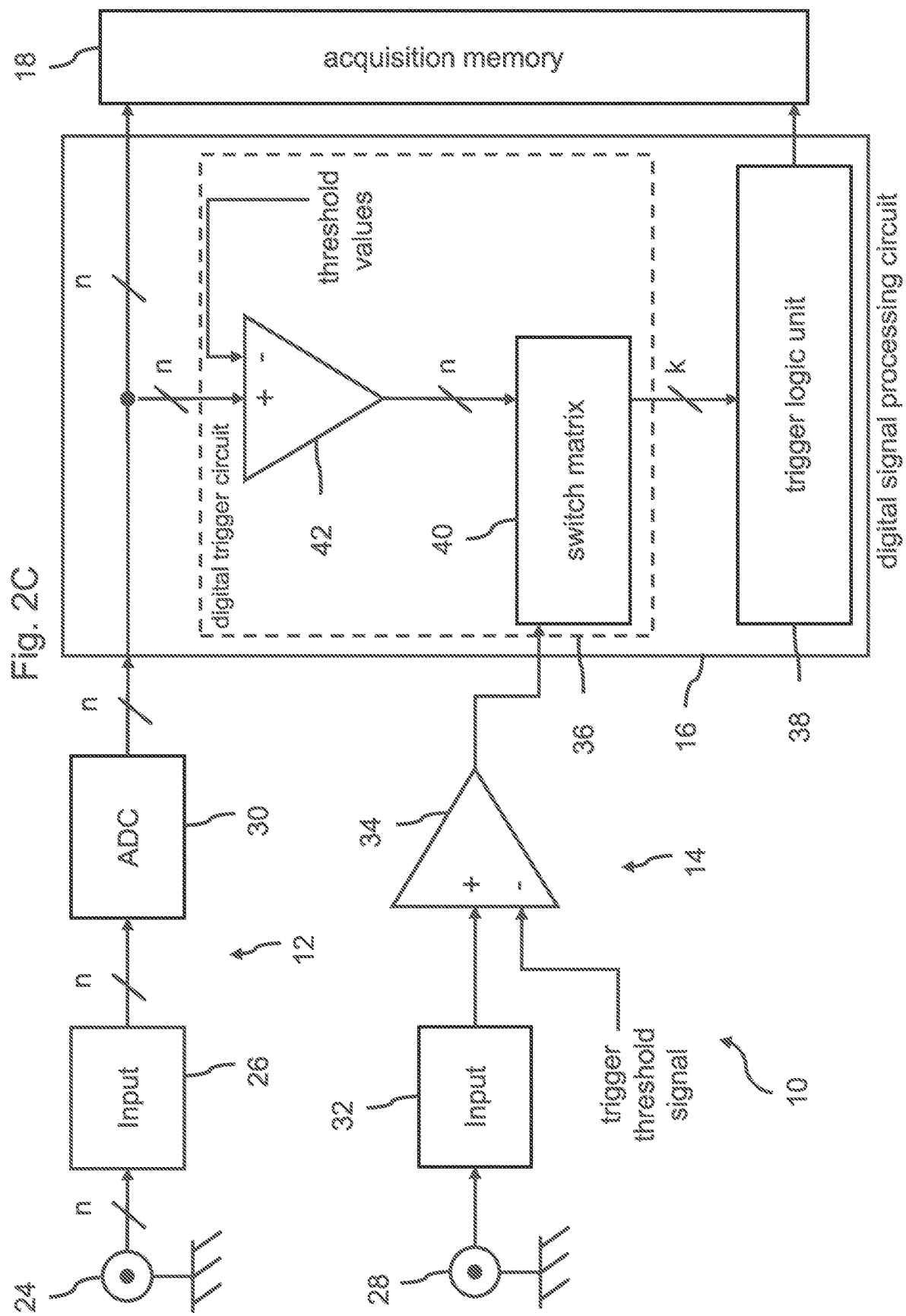

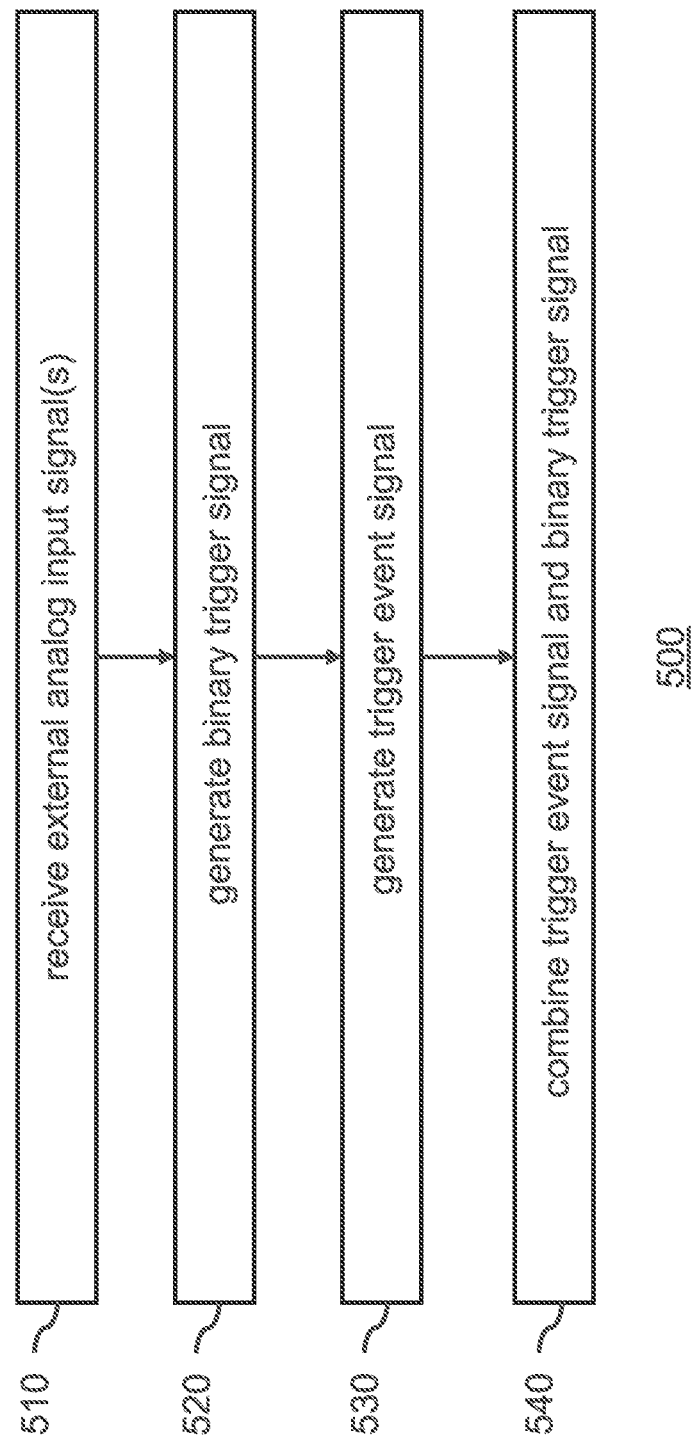

MEASUREMENT SYSTEM AND METHOD FOR GENERATING A TRIGGER SIGNAL FOR A MEASUREMENT SYSTEM

FIELD OF DISCLOSURE

Embodiments of the present disclosure relate to a measurement system and a method for generating a trigger signal for a measurement system. In particular, embodiments of the present disclosure relate to an oscilloscope and a method for generating a trigger signal for an oscilloscope.

BACKGROUND

A measurement system, such as an oscilloscope, is an electronics test and measurement instrument used to acquire, analyze and display a waveform of one or several signals under test (also referred to as "measurement signals"). The measurement signals may be generated by a device under test and may be analog or digital signals. Modern measurement systems continuously acquire and store samples of the measurement signals.

Typically, a measurement system comprises a trigger system that captures signal events for detailed analysis and provides a stable view of repeating waveforms of the measurement signals by always starting the drawing of the waveform on a display of the measurement system in response to detection of a so-called trigger event.

The detection of a trigger event provides a reference point of time. In other words, the trigger system enables a user of the measurement system to acquire, display and analyze signals relative to a specific point in time defined by the trigger event. For example, a measurement system may be used to analyze and debug a complex digital circuit such as a microprocessor to identify events that cause faults or malfunction of these digital circuits. Modern measurement systems are able to detect trigger events from a plurality of signals, even an external trigger signal.

In other words, the trigger event may be a compound trigger event and may be detected from a combination of a plurality of signals.

A measurement system may comprise a digital trigger system that operates directly on the samples of the measurement signals acquired by the measurement system. In other words, the digital trigger system processes the identical signals or signal samples that are acquired and displayed by the measurement system. A digital trigger system provides reduced trigger jittering, the possibility of real-time triggering based on signals that have been digitally pre-processed (e.g. real-time de-embedding, an HD mode) and a trigger hysteresis that is precisely adjustable.

There is a need for a measurement system having a versatile digital trigger system that is able to generate trigger signals based on signals to be measured and/or an external trigger signal.

SUMMARY

Embodiments of the present disclosure provide a measurement system having at least one analog channel comprising an analog-to-digital converter configured to convert an external analog input signal into a corresponding digital input signal; an external trigger input for receiving an external trigger signal and comprising a comparator configured to compare the external trigger signal against a trigger threshold signal for generating a binary trigger signal; and a digital signal processing unit. The digital signal processing unit in some embodiments comprises a digital trigger unit configured to receive the digital input signal and to generate at least one trigger event signal based on the digital input signal, and a trigger logic unit configured to receive the at least one trigger event signal and the binary trigger signal to generate a combined trigger signal.

In other words, a measurement system is provided with a digital trigger system, wherein, in order to generate a trigger signal, the digital signal processing unit of the measurement system is configured to generate a trigger signal based on digital input signals converted from external analog input signals as well as a binary trigger signal generated from an external trigger signal by comparing the external trigger signal against a trigger threshold signal.

Hence, the external trigger signal, as well as one or more of the external analog input signals, may be used as a source for generating a trigger signal for the measurement system. Accordingly, the generated trigger signal is a combined trigger signal. Thus, the advantages of the digital trigger system of the measurement system are combined with the use of an external trigger.

To that end, the digital signal processing unit processes the digital input signals converted by and received from the at least one analog channel and the binary trigger signal generated by and received from the external trigger input and generates the combined trigger signal based on the digital input signals and the binary trigger signal.

The measurement system may be an oscilloscope, for example a digital sampling oscilloscope. The external analog input signals may be measurement signals, that is, signals to be measured and analyzed by the measurement system.

The external analog input signals may be a voltage signal and/or a current signal. Accordingly, the external trigger signal may be a voltage signal and/or a current signal. The external trigger signal may be a digital signal or an analog signal.

The trigger threshold signal may also be referred to as the trigger level.

In some embodiments, the binary trigger signal generated by the comparator of the external trigger input from the external trigger signal may be continuous in time and may have discrete values. As such, the external trigger signal may be processed digitally.

For instance, the binary trigger signal may comprise or may be represented by two values which may be logical values. For example, the two logical values may be "1" and "0", respectively. Accordingly, the binary trigger signal may be processed and stored as a digital signal.

In an embodiment of the disclosure, the digital trigger unit comprises a comparator. The comparator may be configured to receive one or several threshold values. The comparator may further be configured to compare each one of the digital input signals against each one of the threshold values, thereby generating at least one trigger event signal. Thus, also the incoming signals at the analog channels may be used for triggering.

For example, the trigger event signal is similar to the binary trigger signal, e.g., the trigger event signal may as well be a binary signal. That is, each one of the trigger event signals may be continuous in time and may have discrete values. For example, each one of the trigger event signals may be processed and stored as a digital signal.

In an aspect, the trigger threshold signal and/or the at least one threshold value may be a single voltage value. That is, the trigger threshold signal and/or the threshold values may each represent a predetermined voltage value against which the external trigger signal and the digital input signals are compared against, respectively. Hence, external voltage signals may be measured and analyzed by the measurement system and may be used as a source for a trigger signal by the measurement system. Thus, the trigger signal may implement an edge-trigger.

Also, the trigger threshold signal and/or the threshold values may each represent a predetermined pulse width against which the external trigger signal and the digital input signals are compared against, respectively. Accordingly, the trigger signal may implement a pulse width trigger or a glitch trigger.

The digital trigger unit may further comprise a switch matrix. The switch matrix may have at least one input for receiving the at least one digital input signal, the at least one trigger event signal and/or the binary trigger signal and may pre-process each one of the signals allowing to use the various signals for different purposes, e.g., select a signal to be triggered and a signal for triggering.

The switch matrix may have at least one output for outputting the respective pre-processed signals. The number of outputs may be different from the number of inputs. The switch matrix may be connected to the trigger logic unit and/or the digital trigger unit. Hence, the switch matrix may be used to selectively pre-process the respective signals input via inputs and selectively forward the respective signals based on the trigger functionality selected by the user of the measurement system as will be later described in further detail. The pre-processing performed by the switch matrix may be dependent on the respective signal input via its inputs.

Furthermore, the switch-matrix may be flexibly provided at any stage of the processing performed by the digital signal processing unit.

According to an embodiment of the present disclosure, the measurement system comprises at least two of the at least one analog channel, each one of the at least two analog channels receiving a respective external analog input signal and converting the respective external analog input signal into a corresponding digital input signal. Thus, at least two digital input signals may be received by the digital signal processing unit. Further, the switch matrix comprised in the digital signal processing unit is configured to select at least one signal from the at least two digital input signals to be processed by the digital trigger unit. Hence, the digital signal processing unit may trigger on an event on a first external analog input signal to trigger a second external analog input signal.

In other words, the digital signal processing unit may trigger on an event on a first analog channel in order to trigger a signal on a second analog channel. Thus, the triggering may be used to acquire and display a trace of the second external analog input signal.

In another aspect of the disclosure, the measurement system further comprises an acquisition memory, wherein each one of the at least one analog-to-digital converter comprised in the analog channels may be connected to the acquisition memory, wherein the acquisition memory is configured and used to store the respective digital input signals based on the respective external analog input signals. This way, fully digital triggering of the input signal is possible.

The digital input signal may be stored in the acquisition memory as samples. For example, each sample may be a digital value. Each sample may represent a value associated to a respective point in time of the respective digital input signal. Hence, each one of the at least one digital input signal may be stored for further processing and analysis. For example, the samples of the digital input signals may be stored to be displayed later once a trigger event occurs.

In yet another embodiment, the acquisition memory is connected to the trigger logic unit for receiving the combined trigger signal and the digital signal processing unit is configured to control the acquisition memory based on the combined trigger signal to selectively store the at least one digital input signal, to selectively store samples of the at least one digital input signals in the acquisition memory, to select a portion of the at least one digital input signal stored in the acquisition memory and/or to select a portion of samples of the at least one digital input signal stored in the acquisition memory.

Hence, the digital signal processing unit may be configured to acquire a trace of an external analog input signal converted to a digital input signal by, e.g., storing samples of the digital input signal in the acquisition memory or by selecting a portion of samples of the digital input signal stored in the acquisition memory. In other words, the digital processing unit associates a portion of samples of a digital input signal stored or to be stored in the acquisition memory to the combined trigger signal or to a trigger event comprised in the combined trigger signal. The samples comprised in the associated portion may be samples that are acquired consecutively in time from the respective external analog input signal converted into the respective digital input signal. Based on the acquired trace, the respective external analog input signal may be analyzed by a user.

For example, the digital signal processing unit may be configured to control the acquisition memory based on a trigger event occurring on the combined trigger signal.

In another aspect, the measurement system further comprises a display unit and the digital signal processing unit is configured to provide from the acquisition memory to the display unit for displaying the at least one digital input signal, samples of the at least one digital input signal, a selected portion of the at least one digital input signal, and/or a selected portion of samples of the at least one digital input signal. Hence, it is possible to display the trace of the digital input signal represented by the samples of the digital input signal, the selected portion of the digital input signal and/or the selected portion of samples of the digital input signal. The trace may be displayed as a diagram showing the values represented by the digital input signal or the samples of the digital input signal as a function over time. Thus, the trace of the signal may be visualized for a user.

In some embodiments, the trigger logic unit may be configured to generate the combined trigger signal depending on a set of trigger conditions, wherein the set of trigger conditions may be based on the at least one digital input signal, the at least one trigger event signal and the binary trigger signal. In other words, the trigger conditions may take into account the at least one digital input signal, the at least one trigger event signal and the binary trigger signal. Accordingly, it is possible to adapt or select the set of trigger conditions based on the measurement signals that is the external analog input signals to be measured and analyzed by the measurement system. The set of trigger conditions may be selected by a user of the measurement system.

According to an embodiment, the set of trigger conditions is configured to provide sequence trigger functionality, a qualified trigger functionality, a pattern trigger functionality, and/or an or-trigger functionality. Thus, depending on the set of trigger conditions used by the digital signal processing unit, the measurement system may implement at least one of the aforementioned trigger functionalities. The set of trigger conditions used by digital signal processing unit may be programmed by a user or may be selected by a user, e.g. on a user interface of the measurement device, such as a touch screen.

The sequence trigger may comprise an ABR trigger functionality or an ABCD trigger functionality.

For example, the trigger logic unit is configured to selectively combine, based on the set of trigger conditions, the digital input signal, the at least one trigger event signal and/or the binary trigger signal as trigger sources for generating the combined trigger signal. In other words, the set of trigger conditions determines which one of the digital input signal, the at least one trigger event signal and/or the binary trigger signal is used by the trigger logic unit and/or how the trigger logic unit combines the signals in order to generate the combined trigger signal. Accordingly, the set of trigger conditions defines how the combined trigger signal is generated by the trigger logic unit. Hence, the set of trigger conditions may be selected based on, for example, the measurement signals or the behavior of the device under test generating the measurement signals a user wishes to analyze.

In addition to the analog channels receiving and converting respective external analog input signals, the measurement system may comprise at least one external digital input for receiving an external digital input signal. Accordingly, the digital trigger unit may be further configured to generate the at least one trigger event signal based on the digital input signal and further on the external digital input signal. For example, when generating the combined trigger signal, the trigger logic unit may also combine the at least one digital input signal. Hence, the external digital input signal may also be used as trigger source. This allows for an improved flexibility for the user when choosing at least one signal as trigger source for generating the combined trigger signal, since the user may choose the trigger sources among the external digital input signals, the external analog input signals and the external trigger input.

In a further aspect, the digital signal processing unit comprises a FPGA and/or an ASIC. The FPGA and/or the ASIC may comprise the digital trigger unit and/or the trigger logic unit. In other words, the afore-described functionality of each one of the digital trigger unit and the trigger logic unit may be implemented in hardware and/or in software. When the functionality of the digital trigger unit or the trigger logic unit is implemented in software, it may be executed by the digital signal processing unit or one or more computing devices, such as processors, FPGAs, ASICs, DSPs, etc.

In a further embodiment, the measurement system further comprises a user interface unit for receiving a user input, and the set of trigger conditions, the trigger threshold signal, the at least one threshold value and/or a trigger source may be based on the user input. Hence, the user may choose the trigger according to his needs.

The trigger source for generating the combined trigger signal may be freely selected from each of the at least one analog input channel receiving a respective external analog input signal, the digital input channel receiving an external digital input signal, and/or the external trigger input receiving an external trigger signal.

Furthermore, a method for generating a trigger signal for a measurement system, for example an oscilloscope, is provided. The method comprises the steps of:

receiving at least one external analog input signal and converting the external analog input signal into at least one corresponding digital input signal;

receiving an external trigger signal and comparing the external trigger signal against a trigger threshold signal for generating a binary trigger signal;

generating, based on the at least one digital input signal a trigger event signal; and combining the trigger event signal and the binary trigger signal into a combined trigger signal.

Of course, all of the features and advantages discussed in context of the measurement system also apply to the method and vice versa.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

FIG. 2A schematically illustrates a measurement system according to a first embodiment of the present disclosure;

FIG. 2C schematically illustrates a measurement system according to a third embodiment of the present disclosure; and FIG. 3 is a flow diagram illustrating a method for generating a trigger signal for a measurement system according to an embodiment of the present disclosure.

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
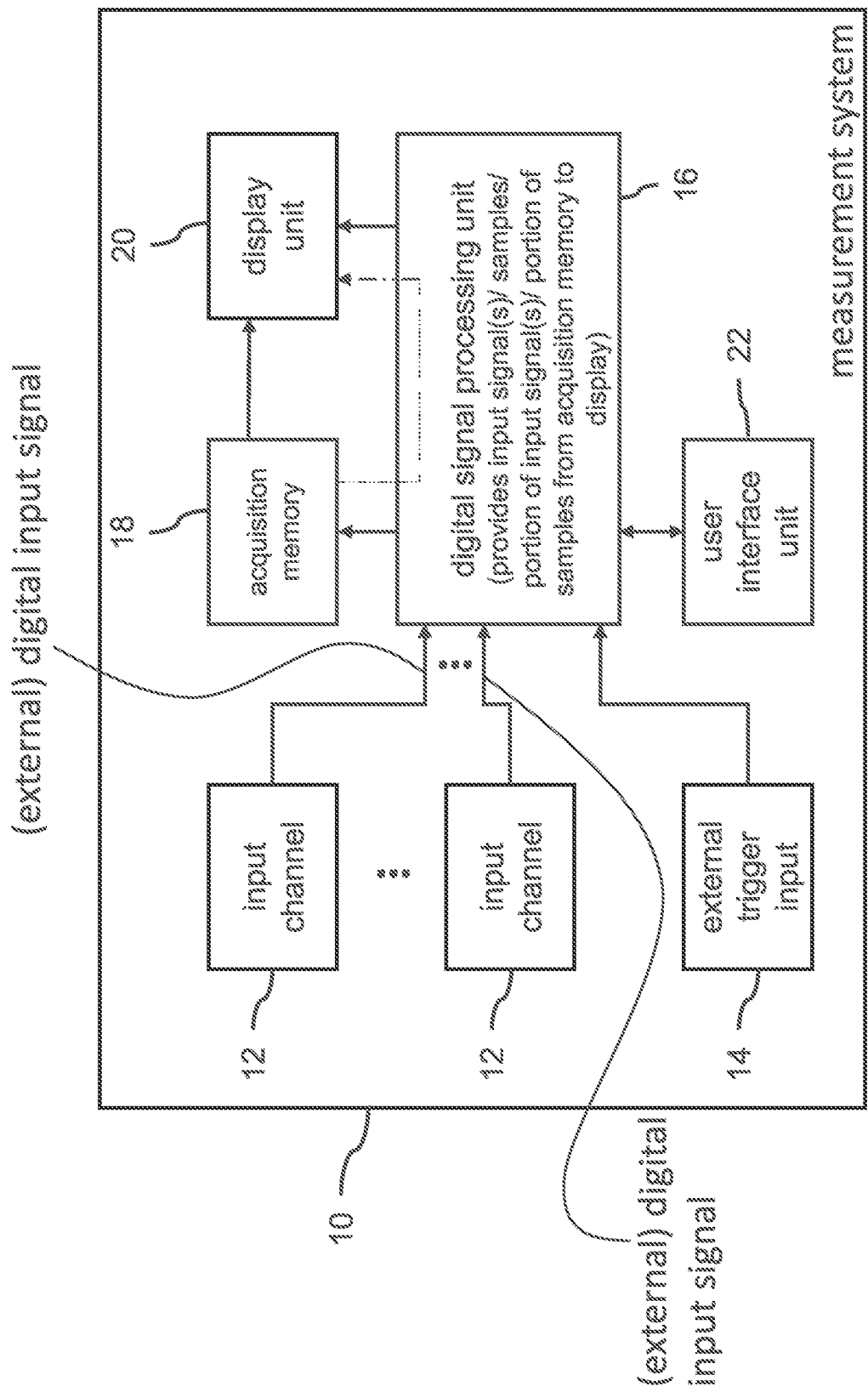
FIG. 1 schematically illustrates a measurement system according to one or more embodiments of the present disclosure.

FIG. 1 is a high-level block diagram schematically illustrating a measurement system 10 according to embodiments of the present disclosure. The measurement system 10 may be an oscilloscope, for example a digital sampling oscilloscope. The measurement system 10 may comprise a digital trigger system.

The measurement system 10 comprises at least one input channel 12. In some embodiments, the measurement system 10 comprises a plurality of input channels 12, usually 2, 4, 8 or 16, as illustrated in FIG. 1. Each of the input channels 12 is configured to receive a respective external input signal. Thus, the measurement system 10 may be configured to receive a plurality of external input signals. Each of the external input signals may be an analog input signal or a digital input signal. For example, an external input signal may be a voltage or current signal and may be provided from a device under test.

Each input channel 12 may be configured to pre-process the respective external input signal. For instance, each input channel 12 may be configured to buffer, amplify, and attenuate the respective external input signal. Furthermore, in case of an analog external input signal, the respective input channel 12 comprises an analog-to-digital converter configured to convert the external analog input signal into a digital input signal.

The measurement system 10 may also comprise an external trigger input 14 configured to receive an external trigger signal. The external trigger input 14 is configured to compare the external trigger signal against a trigger threshold signal in order to generate a binary trigger signal, as will be described later in further detail.

The measurement system 10 further comprises a digital signal processing unit 16. The digital signal processing unit 16 is connected to each one of the input channels 12 and the external trigger input 14. That, is the digital signal processing unit 16 is configured to receive each one of the digital input signals and the binary trigger signal.

The digital signal processing unit 16 is further configured to generate a combined trigger signal. The combined trigger signal may be a binary signal as well, only taking two values, for example two logical values, such as "1" and "0".

The measurement system 10 may further comprise an acquisition memory 18 connected directly to each one of the input channels 12 and to the digital signal processing unit 16. The acquisition memory 18 may be controlled by the digital signal processing unit 16 and it may be implemented as RAM, for instance. In some embodiments, The acquisition memory 18 is controlled by the digital processing unit 16 to selectively store at least one digital input signal or samples of at least one digital input signal, e.g., to store the acquired trace of an external input signal. The portions or samples of the digital input signal to be stored are selected based on the trigger event.

The acquisition memory 18 may also be controlled to continuously store samples of each one of the at least one digital input signals and/or of each one of the external digital input signals. In this case, the digital signal processing unit 16 is configured to acquire a trace of an external input signal by selecting a plurality or a portion of the samples of the respective digital input signal or external digital input signal stored in the acquisition memory 18 based on the trigger event.

The measurement system 10 is configured to acquire and display a trace of one or more of the external input signals based on the combined trigger signal. That is, the measurement system 10 is configured to acquire and display a trace of any one of the external input signals when it detects a trigger event comprised in the trigger signal.

For instance, a trigger event may occur at a point in time when the combined trigger signal changes its value or when the combined trigger signal reaches a predefined value. In case of a binary combined trigger signal, a trigger event may occur each time the combined trigger signal changes its value, or when it reaches the value "0" or when it reaches the value "1" or any other value.

A trace of an external input signal may be a plurality or portion of samples of the respective digital input signal. In case of an external analog input signal, the respective digital input signal is the aforementioned digital input signal converted from the external analog input signal. In case of an external digital input signal, the respective digital input signal is the external digital input signal itself.

The measurement system 10 may further comprise a display unit 20 for displaying the acquired trace. The display unit 20 may be connected to the acquisition memory 18 for receiving the acquired trace and may be connected to the digital signal processing unit 16 for receiving a command for displaying the acquired trace. In some embodiments, the display unit 20 may be configured to display status information such as information about the external input signals, the combined trigger signal, or the like received from the digital signal processing unit 16.

The measurement system 10 may further comprise a user interface unit 22. In some embodiments, the user interface unit 22 may comprise a touch screen integrated into the display unit 20. Alternatively or additionally, the user interface unit 22 may comprise physical buttons, switches, knobs, a computer mouse, a keyboard or the like.

The user interface unit 22 is connected to the digital signal processing unit 16 and is configured to receive user input for controlling the measurement system 10, for example the digital signal processing unit 16. For example, the user may choose how the digital signal processing unit 16 generates the combined trigger signal.

For example, the user may determine at least one trigger source signal, also simply called trigger source. The trigger source signal may be selected from each one of the aforementioned at least one external analog input signal, the at least one external digital input signal or the external trigger signal.

Further, the user may determine, via the user interface unit 22, which trigger functionality is implemented by the measurement system 10. In other words, the user may determine the way the digital signal processing unit 16 generates, based on the selected trigger sources as described above, the combined trigger signal.

The trigger functionality is determined based on a set of trigger conditions that take into account the selected trigger sources. For instance, the set of trigger conditions may be configured to provide a sequence trigger functionality, a qualified trigger functionality, a pattern trigger functionality, and/or an or-trigger functionality.

In some embodiments, the measurement system 10 implements an edge-trigger, a pulse width trigger and/or a glitch trigger. For example, the sequence trigger functionality may comprise an ABR trigger and an ABCD trigger. Furthermore, an edge-then-edge trigger functionality may be implemented.

Based on the set of trigger conditions, arbitrarily complex trigger conditions, that is arbitrarily complex trigger functionalities, may be implemented by combining the aforementioned and other sets of trigger conditions known in the field.

For each functionality, a set of trigger conditions may be stored in the digital signal processing unit 16. Thus, via the user interface unit 22, the user is able to choose which set of trigger conditions is to be used by the digital signal processing unit 16 for generating the combined trigger signal.

Also, the user may determine, via the user interface unit 22, which external input signals from among the at least one external input signal is used by the digital signal processing unit 16 for acquiring a trace thereof, as described above. For instance, the user may choose either one of the at least one external analog input signals or the external trigger signal as trigger source.

The measurement system 10 according to embodiments of the present disclosure as described in reference to FIG. 1 will now be described in further detail with reference to FIGS. 2A to 2C.

FIG. 2A schematically illustrates a measurement system 10 according to a first embodiment of the present disclosure. The measurement system 10 comprises a number n of input channels 12 as described with reference to FIG. 1. For instance, n may be 1, 2, 4, 8 or 16.

Each one of the n input channels 12 may comprise an input 26. The input 26 may be an external terminal of the measurement system 10. For example, the input 26 may be an electrical terminal for connecting a coaxial cable or the like for receiving an external input signal 24 such as an external analog input signal or an external digital input signal. The n input channels 12 may simply be called analog channel or digital channel, depending on the external input channel received via their respective input 26. Each input channel 12 may comprise an analog-to-digital-converter 30 for converting an external analog input signal into a digital input signal for further processing by the digital signal processing unit 16.

As shown in FIG. 2A, each one of the n input channels 12 is connected to the digital signal processing unit 16 and is connected to the acquisition memory 18 via the digital signal processing unit 16. Each one of the n input channels 12 may also be directly connected to the acquisition memory 18.

In the shown embodiment, the external trigger input 14 comprises an input 32 similar to the input 26 of the input channels 12 that is implemented as an electrical terminal of the measurement system 10. Via the input 32 the external trigger input 14 may receive an external trigger signal 28 as described with reference to FIG. 1.

The external trigger input 14 further comprises a comparator 34 for comparing the external trigger signal 28 against a trigger threshold signal. The trigger threshold signal may be a signal generated internally by the measurement system 10 or may also be an external signal received by the measurement system 10 via a further input (not shown).

The trigger threshold signal may be a signal variable over time or may be a predetermined value. In any case, the trigger threshold signal may be selected by a user of the measurement system 10 via the user interface unit 22 as described with reference to FIG. 1.

The comparator 34 is configured to compare the external trigger signal 28 against the trigger threshold signal for generating and outputting the binary trigger signal. In other words, the comparator 34 may generate the trigger event signal, its value being based on the outcome of the comparison of the external trigger signal 28 with the trigger threshold signal.

For example, the binary trigger signal may be continuous in time and take the values "0" and "1", which may be logical values. In case the comparator 34 determines that the current value of the external trigger signal 28 is larger than the value of the trigger threshold signal, the comparator 34 may determine the binary trigger signal to be "1". In case the comparator 34 determines that the current value of the external trigger signal 28 is smaller than the value of the trigger threshold signal, the comparator 34 may determine the binary trigger signal to be "0".

The output of the comparator 34 is connected to the digital signal processing unit 16 for providing the binary trigger signal to the digital signal processing unit 16 for further processing.

In some embodiments, the signal processing unit 16 comprises a digital trigger unit 36 and a trigger logic unit 38. The digital trigger unit 36 is located between the input channels 12 and the trigger logic unit 38 and comprises, for example, a switch matrix 40 and a comparator 42. The trigger logic unit 38 receives the trigger event signal from the digital trigger unit 36, more precisely the comparator 42, and the binary trigger signal from the external trigger input 14, more precisely the comparator 34.

The trigger logic unit 38 is also connected to the acquisition memory 18 for controlling the acquisition of a trace of at least one of the external input signals 24 based on the generated combined trigger signal, as described with reference to FIG. 1.

The digital trigger unit 36, the trigger logic unit 38 and optionally the external trigger input 14 together implement the trigger functionality of the digital signal processing unit 16 as described with reference to FIG. 1, e.g., based on the external digital input signals and/or the digital input signals received from the input channels 12, the binary trigger signal received from the external trigger input 14 and a set of trigger conditions.

As described with reference to FIG. 1, based on the set of trigger conditions selected by a user of the measurement system 10, the digital trigger unit 36 and the trigger logic unit 38 are configured to generate the combined trigger signal implementing the respective trigger functionality.

Thus, by connecting both the external trigger input 14 supplying the binary trigger signal and the input channel supplying the external digital input signals or the digital input signals to the digital signal processing unit 16, the set of trigger conditions may be formulated as a comprehensive set of trigger conditions, that is a set of trigger conditions being based on both the external input signals 24 as well as the external trigger signal 28.

In operation, the set of trigger conditions may then be implemented by the trigger logic unit 38, the digital trigger unit 36, or in combination by both the trigger logic unit 38 and the digital trigger unit 36.

In some embodiments, the switch matrix 40 of the digital trigger unit 36 is a device configured to selectively route signals between multiple inputs and multiple outputs. The switch matrix 40 has the same number n of inputs as the number of input channels 12 but may have m outputs. The number m may be the same number as the number n or it may be a different number. The m outputs are connected to respective inputs of the comparator 42.

In some embodiments, the switch matrix 40 may be configured to pre-process the external digital input signals or the digital input signals received from the respective input channels 12. The switch matrix 40 may also forward the external digital input signals and/or the digital input signals to its outputs as the trigger event signal so as to select the respective signals as trigger sources. The forwarding may happen in accordance to the user input received via the user interface unit 22 as described with reference to FIG. 1.

In some embodiments, the comparator 42 is configured to compare each one of the trigger event signals against a respective threshold signal comprised in a plurality of threshold values. The threshold values may each be variable over time or may each be a predetermined value. In any case, the threshold values may be selected by a user of the measurement system 10 via a user interface unit 22 as described with reference to FIG. 1.

Thus, the comparator 42 is configured to compare each one of the signals received from the switch matrix against the respective trigger threshold values for generating and outputting a single, a plurality or m trigger event signals. In other words, the comparator 42 may generate trigger event signals, the values of which being based on the outcome of the comparison of the digital input signals with the respective threshold values.

The type of trigger event signals may be the same as the type of the binary trigger signal generated by the comparator 34 of the external trigger input 14 as described above.

In any case, the threshold values may be values generated internally by the measurement system 10 or may also be external values received by the measurement system 10 via a further input (not shown).

The outputs of the comparator 42 may be connected to the trigger logic unit 38 for supplying the trigger event signals to the trigger logic unit 38 for further processing based on the set of trigger conditions and to ultimate generate the combined trigger signal.

Figure 2B:
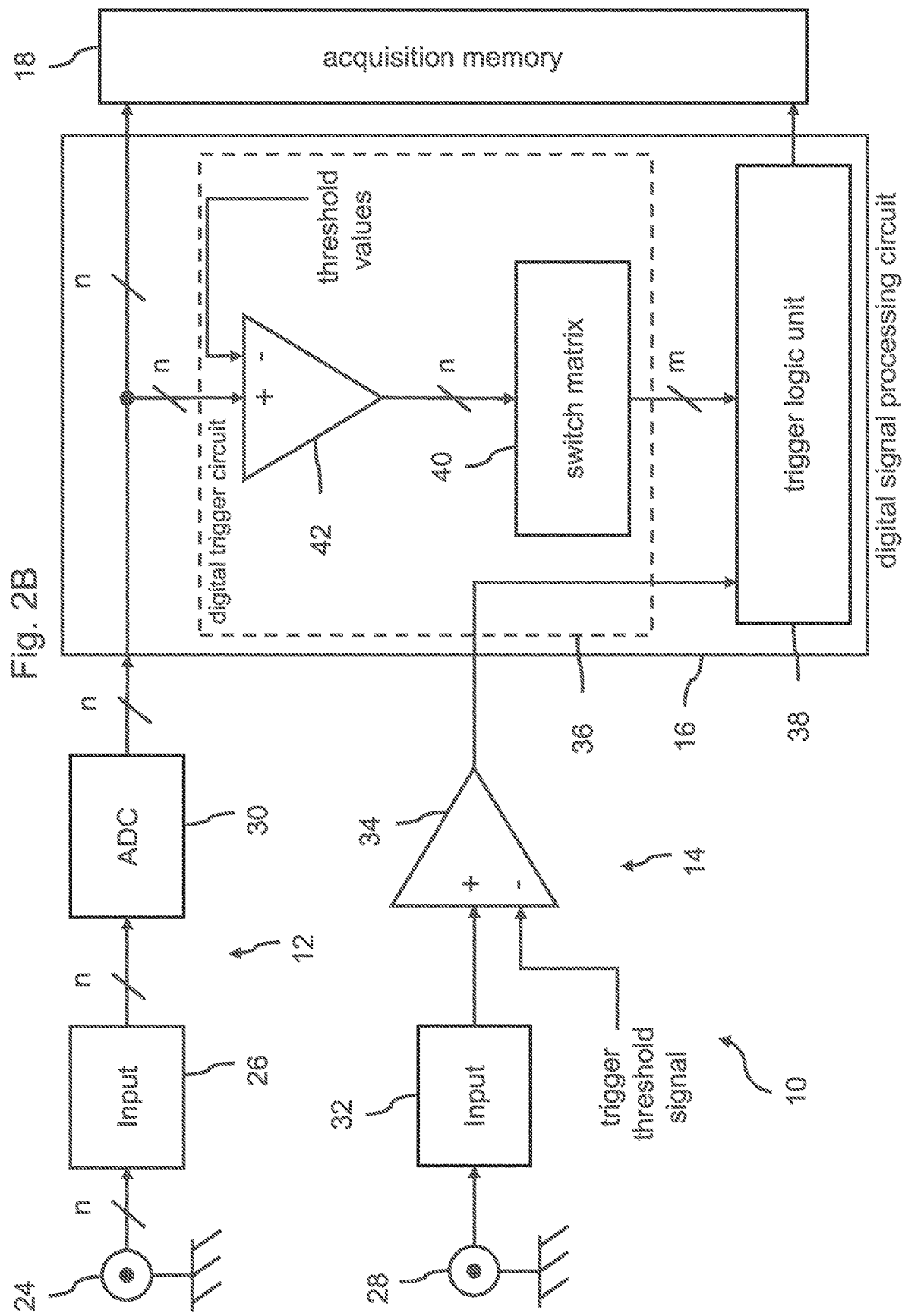
FIG. 2B schematically illustrates a measurement system according to a second embodiment of the present disclosure.

FIG. 2B schematically illustrates a measurement system 10 according to a second embodiment. The measurement system 10 corresponds to the measurement system 10 described with reference to FIG. 2A except for the following differences. A description of similar elements will be omitted, and same or functionally same parts are provided with the same reference number.

In contrast to the measurement system 10 of FIG. 2A, the measurement system 10 shown in FIG. 2B has the position of the switch matrix 40 and the position of the comparator 42 comprised in the digital trigger unit 36 interchanged.

In the measurement system 10 of the second embodiment, the input channels 12 are directly connected to the comparator 42. The comparator 42 has the same number n of inputs as the number of input channels 12. Further, the comparator 42 has the number n of outputs connected to the switch matrix 40 for supplying the trigger event signals to the trigger logic unit 38. Alternatively, the comparator 42 may have a different number of outputs and may have a functionality similar to a switch matrix.

The switch matrix 40 has the same number of inputs for receiving the trigger event signals as the number of outputs of the comparator 42 and may be configured to pre-process the trigger event signals. The switch matrix 40 has a number m of outputs connected to the trigger logic unit 38 for supplying the trigger event signals selected as trigger sources to the trigger logic unit 38 for further processing based on the set of trigger conditions. The number m may be the same number as the number n or it may be a different number.

The signals received by the switch matrix 40 may be selected as trigger sources similarly to what has been described in reference to the switch matrix 40 of the first embodiment.

FIG. 2C schematically illustrates a measurement system 10 according to a third embodiment. The measurement system 10 corresponds to the measurement system 10 described with reference to FIG. 2B except for the following differences. A description of similar elements will be omitted, and same or functionally the same parts are provided with the same reference number.

In contrast to the measurement system 10 of FIG. 2B, the measurement system 10 shown in FIG. 2C also has the external trigger input 14 connected to an input of the switch matrix 40. Thus, the switch matrix 40 has the same number of inputs for receiving the trigger event signals as the number of outputs of the comparator 42 and a further input for receiving the binary trigger signal generated by the external trigger input 14.

The switch matrix 40 has a number k of outputs connected to the trigger logic unit 38 for supplying the binary trigger signals and the trigger event signals selected as trigger sources to the trigger logic unit 38 for further processing based on the set of trigger conditions. The number k may be the same number as the numbers n and/or m or it may be a different number.

Thus, the binary trigger signal and/or the trigger event signal received by the switch matrix 40 may be selected as at least one trigger source similarly to what has been described before.

FIG. 3 is a flow diagram illustrating a method 500 for generating a trigger signal for a measurement system according to an embodiment of the present disclosure.

In a first step 510, at least one external analog input signal is received and converted to into at least one corresponding digital input signal. Furthermore, the method comprises the step 520 of receiving an external trigger signal and comparing the external trigger signal against a trigger threshold signal for generating a binary trigger signal which may or may not be performed in parallel to step 510.

In a next step 530, a trigger event signal based on the at least one digital input signal is generated. Finally, in step 540 the trigger event signal and the binary trigger signal are combined yielding a combined trigger signal.

The method 500 may be implemented by the measurement system according to any one the embodiments of the present disclosure.

According to some embodiments, the a digital signal processing unit 16 comprises a field-programmable gate array (FPGA), an application-specific integrated circuit (ASIC), a digital signal processor (DSP), a microprocessor, etc. Hence, at least some components of the digital signal processing unit 16 are established by the FPGA, ASIC, microprocessor, and/or DSP. In some embodiments, the whole a digital signal processing unit 16 is established by a FPGA, ASIC and/or DSP.

In some embodiments, each block of any of the block diagrams or flowcharts described herein and/or illustrated in the FIGURES, or any combination thereof, may be implemented in part by computer program instructions, e.g., as logical steps or operations executing on a processor in a computing system. These computer program instructions may be loaded onto a computer, such as a special purpose computer or other programmable data processing apparatus to produce a specifically-configured machine, such that the instructions which execute on the computer or other programmable data processing apparatus implement the functions specified in the block diagrams and associated descriptions, etc., and/or carry out the methods described herein. The term computer can include any computing device or processing structure, including but not limited to a processor (e.g., a microprocessor), a central processing unit (CPU), a digital signal processor (DSP), an application-specific integrated circuit (ASIC), a field-programmable gate array (FPGA), a system on a chip (SoC), or the like, or any combinations thereof. Of course, any of these computing devices or processing structure can include or be associated with discrete digital or analog circuit elements or electronics, or combinations thereof.

In some embodiments, one or more units of the a digital signal processing unit 16, include one or more computing devices, such as one or more of the computing devices listed above, associated with a memory storing logic modules and/or instructions for carrying out the function(s) of the digital signal processing unit 16 and/or any of its sub-units, either separately or in any combination. In an embodiment, one or more units of the a digital signal processing unit 16 includes combinations of circuits and computer program products having software or firmware instructions stored on one or more computer readable memories that work together to cause the power device to perform one or more methodologies or technologies described herein. In other embodiments, the digital signal processing unit 16 or one or more units of the a digital signal processing unit 16 includes hardware circuit implementations (e.g., implementations in analog circuitry, implementations in digital circuitry, and the like, and combinations thereof).

The present application may also reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A, B, and C," for example, means (A), (B), (C), (A and B), (A and C), (B and C), or (A, B, and C), including all further possible permutations when greater than three elements are listed.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. For example the features of the described embodiments may be combined with one another in any combination. Accordingly, it is expressly intended that all such variations, changes, and equivalents fall within the spirit and scope of the present disclosure, as claimed.

The invention claimed is:

1. A measurement system having:
    at least one analog channel comprising an analog-to-digital converter configured to convert an external analog input signal into a corresponding digital input signal;
    an external trigger input for receiving an external trigger signal and comprising a first comparator configured to compare said external trigger signal against a trigger threshold signal for generating a binary trigger signal;
    a digital signal processing circuit configured to:
        receive said digital input signal;
        generate at least one trigger event signal based on said digital input signal;
        receive said binary trigger signal; and
        generate a combined trigger signal dependent on a set of trigger conditions based on said at least one digital input signal, said at least one trigger event signal and said binary trigger signal; and
    an acquisition memory, wherein said at least one analog-to-digital converter is connected to said acquisition memory for storing said at least one digital input signal or samples of said at least one digital input signal in said acquisition memory,
    wherein said acquisition memory is connected to said digital processing circuit for receiving said combined trigger signal, and
    wherein said digital signal processing circuit is configured to control the acquisition memory based on said combined trigger signal to select a portion of said at least one digital input signal stored in the acquisition memory or a portion of samples of said at least one digital input signal stored in the acquisition memory.

2. The measurement system according to claim 1, wherein said binary trigger signal is continuous in time and has discrete values.

3. The measurement system according to claim 1, wherein said digital processing circuit comprises a second comparator, wherein said second comparator is configured to receive at least one threshold value and is further configured to compare said digital input signal against said at least one threshold value for generating said at least one trigger event signal.

4. The measurement system according to claim 3, wherein at least one of said trigger threshold signal or said at least one threshold value is a single voltage value for an edge-trigger or a pulse width for a pulse width trigger or a glitch trigger.

5. The measurement system according to claim 1, wherein said digital processing circuit comprises a switch matrix, wherein said switch matrix is configured to pre-process at least one of said digital input signal or said at least one trigger event signal.

6. The measurement system according to claim 5, wherein said switch matrix is further configured to pre-process said binary trigger signal.

7. The measurement system according to claim 5, further comprising at least two of the at least one analog channel, each one of the at least two analog channels being configured to receive a respective external analog input signal and to convert the respective external analog input signal into a corresponding digital input signal, thereby obtaining at least two digital input signals, wherein said switch matrix is configured to select signals to be processed by said digital processing circuit from said at least two digital input signals.

8. The measurement system according to claim 1, wherein said digital signal processing circuit is configured to control the acquisition memory based on said combined trigger signal to:
    selectively store said at least one digital input signal or samples of said at least one digital input signals in said acquisition memory.

9. The measurement system according to claim 8, further comprising a display, wherein said digital signal processing circuit is configured to provide from the acquisition memory to said display for displaying said at least one digital input signal, samples of said at least one digital input signal, a selected portion of said at least one digital input signal, or a selected portion of samples of said at least one digital input signal.

10. The measurement system according to claim 1, wherein said set of trigger conditions is configured to provide a qualified trigger.

11. The measurement system according to claim 1, wherein said digital processing circuit is configured to selectively combine, based on said set of trigger conditions, at least said digital input signal and said binary trigger signal as trigger sources for generating said combined trigger signal.

12. The measurement system according to claim 1, further comprising
    at least one external digital input for receiving an external digital input signal,
    wherein said digital processing circuit is further configured to generate said at least one trigger event signal based on said digital input signal from said analog-to-digital converter and further on said external digital input signal.

13. The measurement system according to claim 1, wherein said digital signal processing circuit comprises at least one of a FPGA or an ASIC.

14. The measurement system according to claim 1, further comprising a user interface for receiving a user input, wherein at least one of said trigger conditions, said trigger threshold signal, a threshold value associated with a comparator of said digital processing circuit, or a trigger source are based on said user input.

15. The measurement system according to claim 14, wherein the trigger source is selected out of each of said at least one analog input channel, said digital input channel and said external trigger input.

16. A method for generating a trigger signal for a measurement system, said method comprising the steps of:
   receiving at least one external analog input signal and converting said external analog input signal into at least one corresponding digital input signal by an analog-to-digital converter;
   receiving an external trigger signal by an external trigger input and comparing, by a first comparator, said external trigger signal against a trigger threshold signal for generating a binary trigger signal;
   generating, by a digital signal processing circuit, a trigger event signal based on said at least one digital input signal;
   combining, by said digital processing circuit, said trigger event signal and said binary trigger signal, thereby forming a combined trigger signal,
   storing, in an acquisition memory, said at least one digital input signal or samples of said at least one digital input signal,
   wherein said acquisition memory is connected to said digital processing circuit for receiving said combined trigger signal, and
   wherein said acquisition memory is controlled by said digital signal processing circuit based on said combined trigger signal to select a portion of said at least one digital input signal stored in the acquisition memory or a portion of samples of said at least one digital input signal stored in the acquisition memory.

* * * * *